US012694187B2

(12) United States Patent
Kawasaki et al.

(10) Patent No.: US 12,694,187 B2
(45) Date of Patent: Jul. 28, 2026

(54) PATTERN GENERATION DEVICE, PATTERN GENERATION METHOD AND NON-TRANSITORY COMPUTER-READABLE MEDIUM

(71) Applicants: Sumitomo Electric Industries, Ltd., Osaka (JP); National University Corporation Hokkaido University, Sapporo (JP)

(72) Inventors: Takeshi Kawasaki, Osaka (JP); Hajime Igarashi, Sapporo (JP)

(73) Assignees: Sumitomo Electric Industries, Ltd., Osaka (JP); National University Corporation Hokkaido University, Sapporo (JP)

( * ) Notice: Subject to any disclaimer, the term of this patent is extended or adjusted under 35 U.S.C. 154(b) by 852 days.

(21) Appl. No.: 18/099,295

(22) Filed: Jan. 20, 2023

(65) Prior Publication Data

US 2023/0267258 A1     Aug. 24, 2023

(30) Foreign Application Priority Data

Feb. 18, 2022     (JP) ................................. 2022-023752

(51) Int. Cl.
G06F 30/39 (2020.01)
(52) U.S. Cl.
CPC .................................... G06F 30/39 (2020.01)
(58) Field of Classification Search
USPC ....................................................... 716/100
See application file for complete search history.

(56) References Cited

U.S. PATENT DOCUMENTS

| 5,905,654 A | * | 5/1999 | Tanino | ..................... | G06F 30/39 |
| | | | | | 716/135 |
| 2009/0249264 A1 | * | 10/2009 | Uriu | ...................... | G06F 30/367 |
| | | | | | 716/103 |

FOREIGN PATENT DOCUMENTS

| JP | 10-256380 A | 9/1998 |
| JP | 2008-299686 A | 12/2008 |
| JP | 2013-025533 A | 2/2013 |

* cited by examiner

*Primary Examiner* — Mohammed Alam
(74) *Attorney, Agent, or Firm* — Volpe Koenig

(57) ABSTRACT

A pattern generation device includes a memory and a processor coupled to the memory. The processor is configured to generate pattern data corresponding to a pattern of a metal layer based on a generation condition, determine whether the generated pattern data satisfies a predetermined condition, return to generate the pattern data when the predetermined condition is not satisfied, calculate a characteristic of the pattern or an element or circuit having the pattern when a high-frequency signal is inputted to a first portion and a high-frequency signal is outputted from a second portion by performing an electromagnetic field analysis based on the pattern data when the predetermined condition is satisfied, determine whether the calculated characteristic is within a target range, change the generation condition when the calculated characteristic is not within the target range, and return to generate the pattern data after changing the generation condition.

11 Claims, 16 Drawing Sheets

PATTERN DATA D1

PATTERN DATA D2

DETERMINATION DATA E1

PATTERN DATA D3

PATTERN GENERATION DEVICE, PATTERN GENERATION METHOD AND NON-TRANSITORY COMPUTER-READABLE MEDIUM

CROSS REFERENCE TO RELATED APPLICATIONS

This application claims priority based on Japanese Patent Application No. 2022-023752 filed on Feb. 18, 2022, and the entire contents of the Japanese patent application are incorporated herein by reference.

FIELD

The present disclosure relates to a pattern generation device, a pattern generation method and a non-transitory computer-readable medium.

BACKGROUND

As a passive element for microwave, a component in which a metal pattern having a stub or the like is provided on a dielectric layer is used. A high-frequency signal is inputted to a certain position in the metal pattern and a high-frequency signal is outputted from another position. By changing the planar shape of the metal pattern, a high-frequency characteristic such as S parameters in the passive element is changed. It is known that topology shape optimization is used for shape optimization of a structure (for example, Japanese Laid-open Patent Publication No. 2013-25533). It is known that an analog circuit is automatically laid out (for example, Japanese Laid-open Patent Publications Nos. 10-256380 and 2008-299686).

SUMMARY

One embodiment of the present disclosure is a pattern generation device includes a memory; and a processor coupled to the memory. The processor is configured to: generate pattern data corresponding to a pattern of a metal layer provided on a surface of a dielectric layer based on a generation condition; determine whether the generated pattern data satisfies a predetermined condition; return to generate the pattern data when it is determined that the predetermined condition is not satisfied; calculate a characteristic of the pattern or an element or circuit having the pattern when a high-frequency signal is inputted to a first portion of the pattern and a high-frequency signal is outputted from a second portion of the pattern by performing an electromagnetic field analysis based on the pattern data when it is determined that the predetermined condition is satisfied; determine whether the calculated characteristic is within a target range; change the generation condition when it is determined that the calculated characteristic is not within the target range; and return to generate the pattern data after changing the generation condition.

Another embodiment of the present disclosure is a pattern generation method that causes a computer to execute a process. The process includes generating pattern data corresponding to a pattern of a metal layer provided on a surface of a dielectric layer based on a generation condition; determining whether the generated pattern data satisfies a predetermined condition; returning to the generating the pattern data when it is determined that the predetermined condition is not satisfied; calculating a characteristic of the pattern or an element or circuit having the pattern when a high-frequency signal is inputted to a first portion of the pattern and a high-frequency signal is outputted from a second portion of the pattern by performing an electromagnetic field analysis based on the pattern data when it is determined that the predetermined condition is satisfied; determining whether the calculated characteristic is within a target range; changing the generation condition when it is determined that the calculated characteristic is not within the target range; and returning to the generating the pattern data after the changing the generation condition.

The other embodiment of the present disclosure is a non-transitory computer-readable recording medium storing a program that causes a computer to execute a process. The process includes generating pattern data corresponding to a pattern of a metal layer provided on a surface of a dielectric layer based on a generation condition; determining whether the generated pattern data satisfies a predetermined condition; returning to the generating the pattern data when it is determined that the predetermined condition is not satisfied; calculating a characteristic of the pattern or an element or circuit having the pattern when a high-frequency signal is inputted to a first portion of the pattern and a high-frequency signal is outputted from a second portion of the pattern by performing an electromagnetic field analysis based on the pattern data when it is determined that the predetermined condition is satisfied; determining whether the calculated characteristic is within a target range; changing the generation condition when it is determined that the calculated characteristic is not within the target range; and returning to the generating the pattern data after the changing the generation condition.

DETAILED DESCRIPTION

Figure 1:
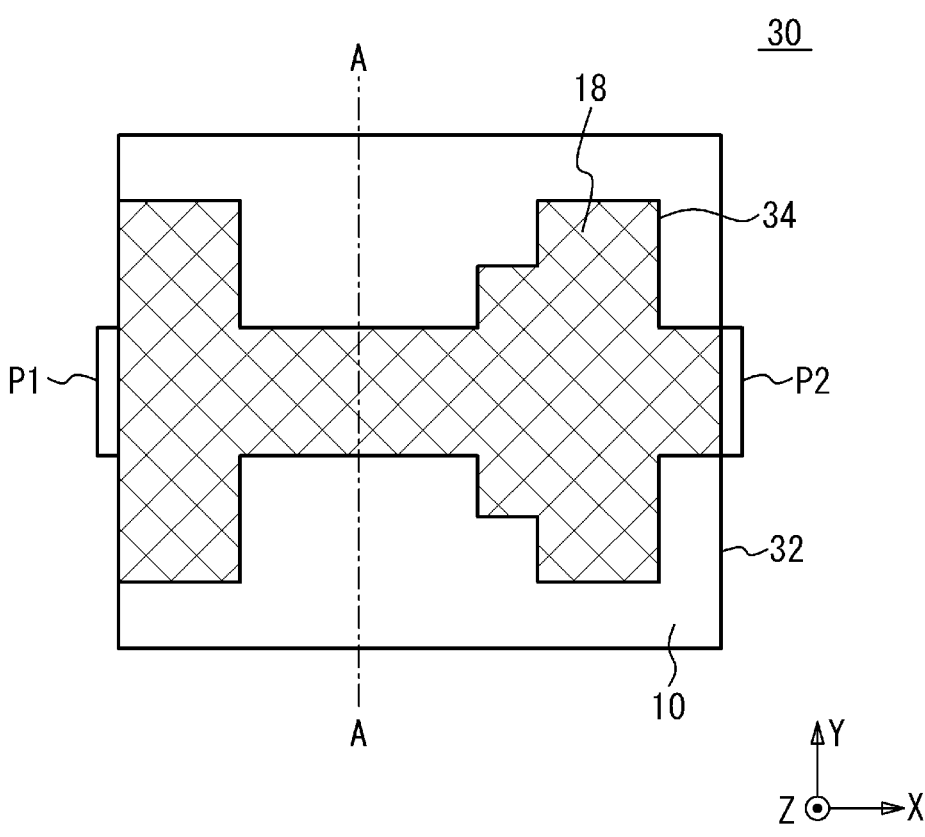
FIG. 1 is a plan view illustrating a pattern of a passive element designed according to the first embodiment.

When a pattern formed by a metal layer provided on a dielectric layer is used as an element such as a passive element of an electronic circuit, as a method for optimizing the planar shape of the pattern from the viewpoint of a high-frequency characteristic, it is conceivable to perform topology shape optimization in which the planar shape of the pattern is optimized by freely deforming the planar shape of the pattern. The high-frequency characteristic of the element such as the passive element or the circuit can be calculated by performing electromagnetic field analysis on the planar shape of the generated pattern. However, it takes a great deal of time to calculate the high-frequency characteristic of the passive element or the like from the planar shape of the pattern using the electromagnetic field analysis.

The present disclosure has been made in view of the above problem, and an object of the present disclosure is to efficiently generate a pattern.

Description of Embodiments of the Present Disclosure

First, the contents of embodiments of the present disclosure will be listed and described.

(1) One embodiment of the present disclosure is a pattern generation device includes a memory; and a processor coupled to the memory. The processor is configured to: generate pattern data corresponding to a pattern of a metal layer provided on a surface of a dielectric layer based on a generation condition; determine whether the generated pattern data satisfies a predetermined condition; return to generate the pattern data when it is determined that the predetermined condition is not satisfied; calculate a characteristic of the pattern or an element or circuit having the pattern when a high-frequency signal is inputted to a first portion of the pattern and a high-frequency signal is outputted from a second portion of the pattern by performing an electromagnetic field analysis based on the pattern data when it is determined that the predetermined condition is satisfied; determine whether the calculated characteristic is within a target range; change the generation condition when it is determined that the calculated characteristic is not within the target range; and return to generate the pattern data after changing the generation condition.

(2) The processor may change the generation condition so that the characteristic calculated based on pattern data generated based on the changed generation condition approaches the target range.

(3) When it is determined that the predetermined condition is not satisfied, before returning to generate the pattern data, the processor may change the generation condition so that the pattern data generated based on the changed generation condition approaches the predetermined condition.

(4) When the processor generates the pattern data, the processor may generate a plurality of weights respectively associated with a plurality of positions on the surface, and generate the pattern data based on the generated plurality of weights. The generation condition may be a condition for generating the plurality of weight.

(5) When the processor generates the pattern data, the processor may calculate a plurality of functions each having a position in the surface as a variable, the plurality of function being related to the plurality of positions and having the plurality of weights, respectively, and generate the pattern in a corresponding unit region when an integrated value of the plurality of functions in the corresponding unit region is within a predetermined range for each of a plurality of unit regions in which the surface is divided, and never generate the pattern in the corresponding unit region when the integrated value is not within the predetermined range.

(6) The plurality of functions may be Gaussian basis functions centered at the plurality of positions.

(7) The predetermined condition may be that the first portion and the second portion are physically connected via the pattern.

(8) When it is determined that the predetermined condition is not satisfied, before returning to generate the pattern data, the processor may change the generation condition so that a minimum distance between a pattern connected to the first portion and a pattern connected to the second portion in the pattern data generated based on the changed generation condition becomes small.

(9) When the processor generates the pattern data, the processor may generate a plurality of different pattern data. The processor may determine that the predetermined condition is satisfied when at least one of the plurality of pattern data satisfies the predetermined condition, and determine that the predetermined condition is not satisfied when all of the plurality of pattern data do not satisfy the predetermined condition.

(10) Another embodiment of the present disclosure is a pattern generation method that causes a computer to execute a process. The process includes: generating pattern data corresponding to a pattern of a metal layer provided on a surface of a dielectric layer based on a generation condition; determining whether the generated pattern data satisfies a predetermined condition; returning to the generating the pattern data when it is determined that the predetermined condition is not satisfied; calculating a characteristic of the pattern or an element or circuit having the pattern when a high-frequency signal is inputted to a first portion of the pattern and a high-frequency signal is outputted from a second portion of the pattern by performing an electromagnetic field analysis based on the pattern data when it is determined that the predetermined condition is satisfied; determining whether the calculated characteristic is within a target range; changing the generation condition when it is determined that the calculated characteristic is not within the target range; and returning to the generating the pattern data after the changing the generation condition.

(11) The other embodiment of the present disclosure is a non-transitory computer-readable recording medium storing a program that causes a computer to execute a process. The process includes: generating pattern data corresponding to a pattern of a metal layer provided on a surface of a dielectric layer based on a generation condition; determining whether the generated pattern data satisfies a predetermined condition; returning to the generating the pattern data when it is determined that the predetermined condition is not satisfied; calculating a characteristic of the pattern or an element or circuit having the pattern when a high-frequency signal is inputted to a first portion of the pattern and a high-frequency signal is outputted from a second portion of the pattern by performing an electromagnetic field analysis based on the pattern data when it is determined that the predetermined condition is satisfied; determining whether the calculated characteristic is within a target range; changing the generation condition when it is determined that the calculated characteristic is not within the target range; and returning to the generating the pattern data after the changing the generation condition.

Details of Embodiments of the Present Disclosure

Specific examples of capacitors according to embodiments of the present disclosure will be described below with reference to the drawings. Note that the present disclosure is not limited to these examples, but is indicated by the scope of the claims, and is intended to include all modifications within the meaning and the range equivalent to the scope of the claims.

First Embodiment

Figure 2:
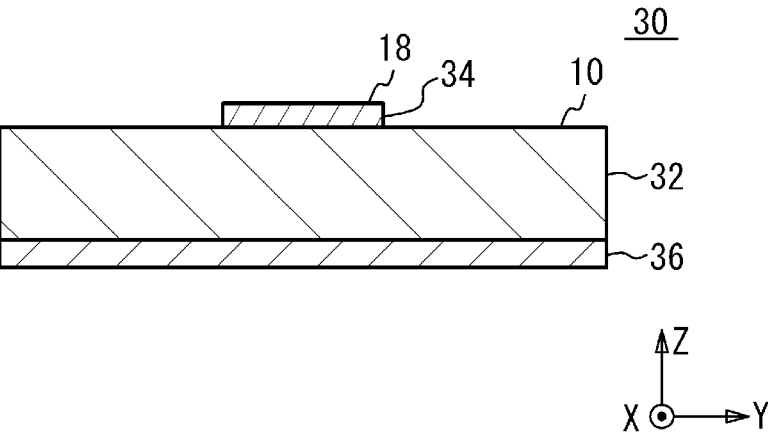
FIG. 2 is a cross-sectional view taken along line A-A of FIG. 1.

A passive element for a high-frequency circuit will be described as an example of a pattern optimized according to the first embodiment. FIG. 1 is a plan view illustrating a pattern of the passive element designed in the first embodiment, and FIG. 2 is a cross-sectional view taken along line A-A of FIG. 1. A direction normal to a surface 10 of a dielectric layer 32 is a Z direction, a direction parallel to the surface 10 and in which an input port P1 and an output port P2 are arranged is an X direction, and a direction parallel to the surface 10 and orthogonal to the X direction is a Y direction.

As illustrated in FIGS. 1 and 2, in the passive element 30, a metal layer 34 is provided on the surface 10 of the dielectric layer 32. A pattern 18 is formed from the metal layer 34. A metal layer 36 is provided on the entire lower surface of the dielectric layer 32. An end portion of the pattern 18 on the − direction side in the X direction is connected to the input port P1, and an end portion of the pattern 18 on the + direction side in the X direction is connected to the output port P2. A high-frequency signal is inputted to the input port P1, and the high-frequency signal is outputted from the output port P2. The high-frequency signal is, for example, a microwave or a millimeter wave having a frequency of 0.3 GHZ or more. Depending on the planar shape of the pattern 18, a high-frequency characteristic such as S parameters (S11, S12, S21 and S22) between the input port P1 and the output port P2 changes. The planar shape of the pattern 18 is designed in order to obtain a desired high-frequency characteristic.

Figure 3:
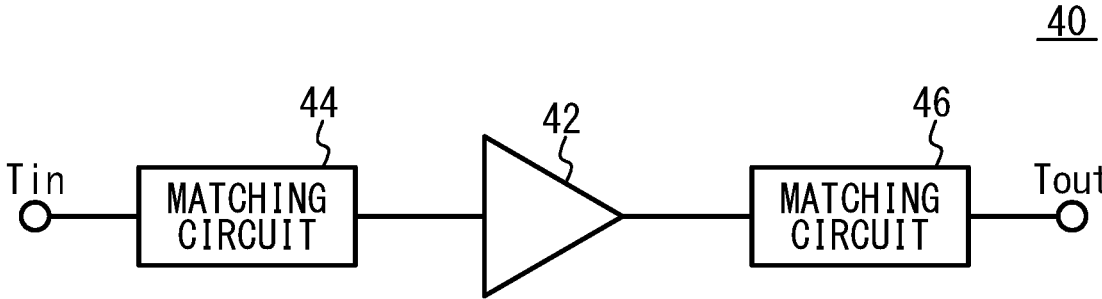
FIG. 3 is a block diagram of an amplifier circuit designed in the first embodiment.

Next, an example of an amplifier circuit using the passive element 30 will be described. FIG. 3 is a block diagram of the amplifier circuit designed in the first embodiment. As illustrated in FIG. 3, an amplifier circuit 40 includes an amplifier 42 and matching circuits 44 and 46. The amplifier 42 is, for example, a transistor such as GaN HEMT (Gallium Nitride High Electron Mobility Transistor). The high-frequency signal inputted to the input terminal Tin is inputted to the amplifier 42 through the matching circuit 44. The matching circuit 44 matches an impedance seen from an input terminal Tin to the matching circuit 44 with an impedance seen from the matching circuit 44 to the amplifier 42. The high-frequency signal amplified by the amplifier 42 is output from an output terminal Tout via the matching circuit 46. The matching circuit 46 matches an impedance seen from the amplifier 42 to the matching circuit 46 with an impedance seen from the matching circuit 46 to the output terminal Tout. At least a part of the matching circuits 44 and 46 is formed by the passive element 30 of FIGS. 1 and 2. By adjusting the high-frequency characteristics of the matching circuits 44 and 46, the characteristic of the amplifier circuit 40 can be designed to have a desired characteristic.

Figure 4:
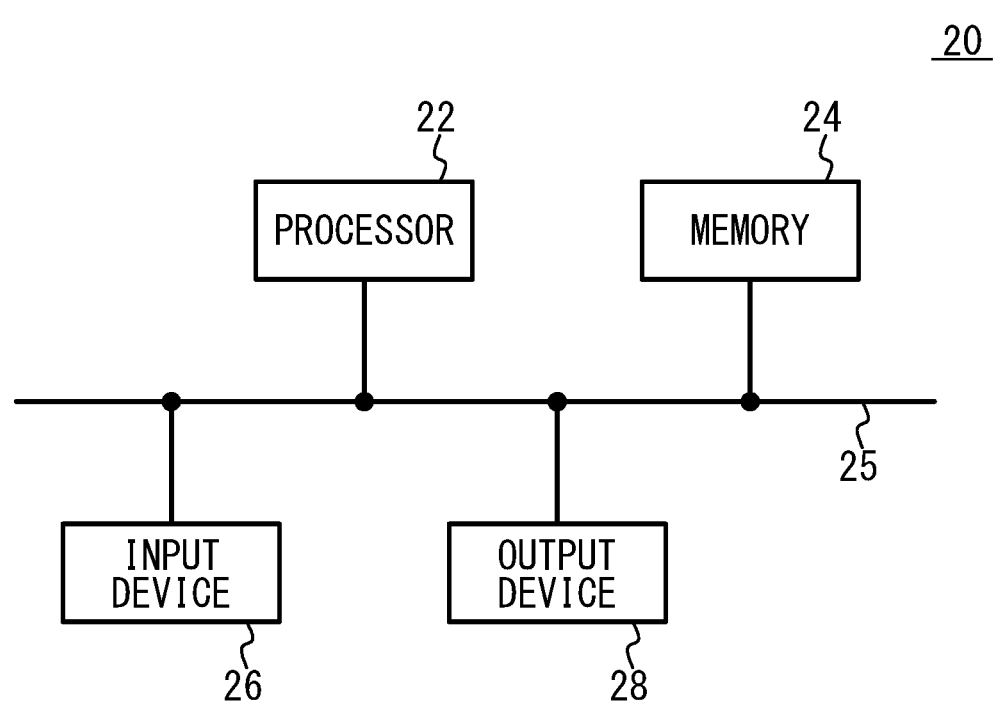
FIG. 4 is a block diagram illustrating a computer for executing a pattern generation program and a pattern generation method according to the first embodiment.

FIG. 4 is a block diagram illustrating a computer for executing a pattern generation program and a pattern generation method according to the first embodiment. As illustrated in FIG. 4, the computer 20 as a pattern generation device includes a processor 22, a memory 24, an input device 26, an output device 28, and an internal bus 25. The processor 22 is, for example, a central processing unit (Central Processing Unit) and mainly executes the pattern generation program and the pattern generation method. The memory 24 is, for example, a volatile memory or a non-volatile memory and stores data for executing the pattern generation program and the pattern generation method. The input device 26 is an input interface for inputting information for generating a pattern from the outside, for example. The output device 28 is, for example, an output interface for outputting the result of the generated pattern. Data or information is transmitted and received between the processor 22, the memory 24, the input device 26 and the output device 28 via the internal bus 25. The pattern generation program may be stored in a non-temporary tangible recording medium such as a CD-ROM (Compact Disk Read Only Memory).

Figure 5:
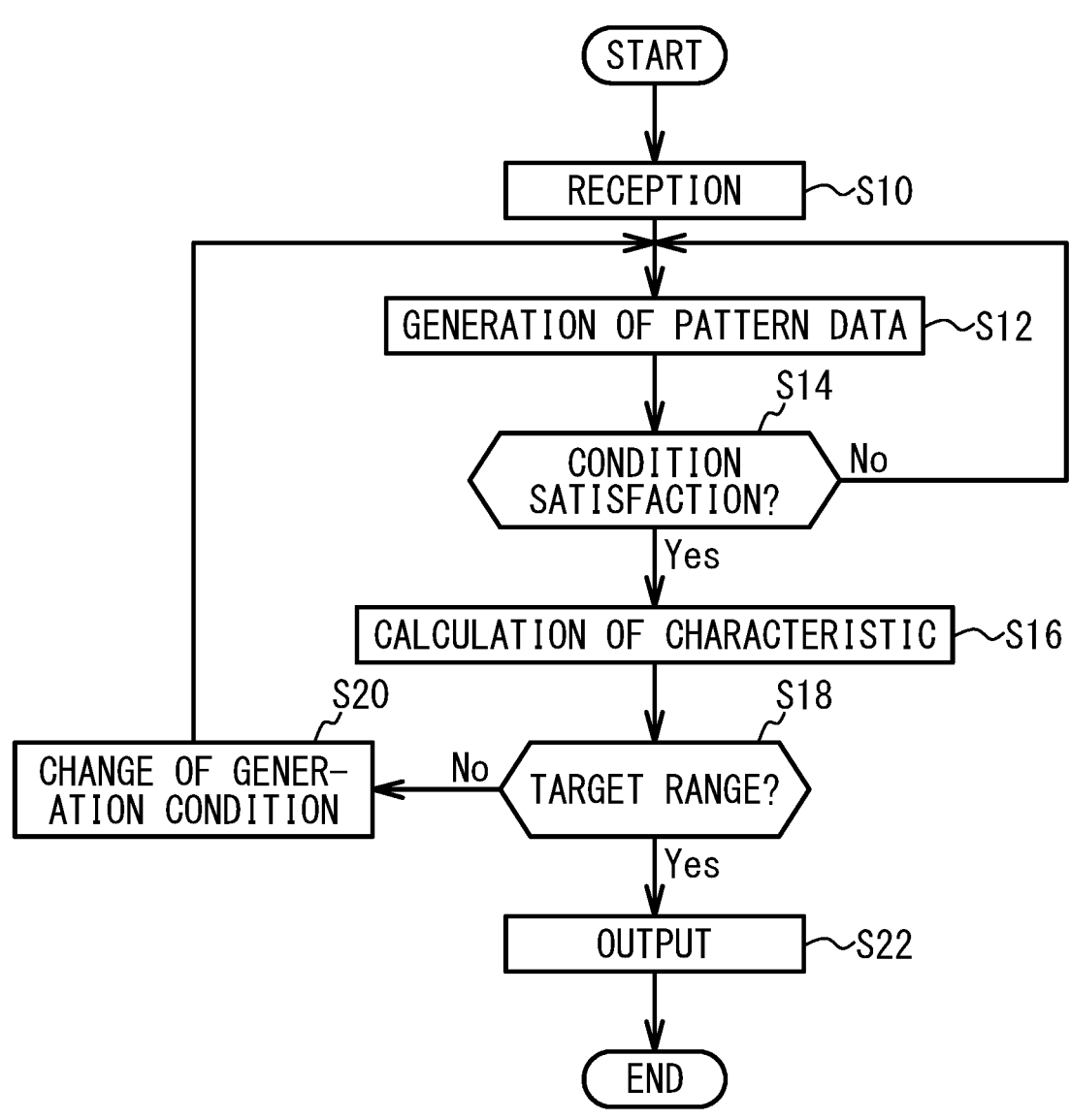
FIG. 5 is a flowchart illustrating processing of the computer according to the first embodiment.

FIG. 5 is a flowchart illustrating the processing of the computer according to the first embodiment. As illustrated in FIG. 5, the processor 22 receives input information via the input device 26 (step S10). The processor 22 generates pattern data relating to the planar shape of the pattern 18 in the surface 10 based on the input information, information relating to the initial weight, and a generation condition for generating the pattern data (step S12). For example, the processor 22 generates pattern data corresponding to the pattern 18 of the metal layer 34 provided on the surface 10 based on a plurality of weights described later. The processor 22 may generate one pattern data or may generate a plurality of pattern data at random.

The processor 22 determines whether the pattern data satisfies a predetermined condition (step S14). For example, the processor 22 determines that the result of step S14 is Yes when the input port P1 and the output port P2 are physically connected by the pattern 18, and determines that the result of step S14 is No when the input port P1 and the output port P2 are not physically connected by the pattern 18. In step S12, when a plurality of pattern data are generated, the processor 22 determines that the predetermined condition is satisfied when at least one of the plurality of pattern data satisfies the predetermined condition, and determines that the predetermined condition is not satisfied when all of the plurality of pattern data do not satisfy the predetermined condition.

In the case of No in step S14, the process returns to step S12. In step S12, the processor 22 randomly generates pattern data different from the pattern data generated until the previous step S12 after receiving the input information in step S10.

In the case of Yes in step S14, the processor 22 calculates the characteristic of the pattern 18, the element or the circuit using the pattern data determined to satisfy the predetermined condition in step S14 (step S16). For example, the processor 22 performs electromagnetic field analysis on the passive element 30 illustrated in FIGS. 1 and 2 using pattern data determined to satisfy the predetermined condition (for example, by using the data pattern 18), and calculates the high-frequency characteristic between the input port P1 and the output port P2 or the characteristic of the pattern 18. The processor 22 may calculate the characteristic of an electronic circuit such as the amplifier circuit 40 using the calculated high-frequency characteristic or pattern characteristic of the passive element 30. The processor 22 may cause the memory 24 to store the pattern data having the calculated characteristic in association with the calculated characteristic. In step S12, a plurality of pattern data are generated, and in step S14, when the plurality of pattern data satisfy the predetermined condition, the processor 22 calculates characteristics for the plurality of pattern data satisfying the predetermined condition.

The processor 22 determines whether the calculated characteristic is within a target range (step S18). When the target characteristic is the high-frequency characteristic of the passive element 30 or the characteristic of the pattern 18, the processor 22 determines whether the calculated high-frequency characteristic of the passive element 30 or the calculated characteristic of pattern 18 is within the target range. When the target characteristic is the characteristic of the amplifier circuit 40 using the passive element 30 or the like, the processor 22 determines whether the characteristic of the amplifier circuit 40 or the like is within the target range. If a plurality of characteristics corresponding to different plurality of pattern data are calculated in step S16, when at least one of the calculated plurality of characteristics is within in the target range, the processor 22 determines that the characteristics are within the target range. When all of the calculated plurality of characteristics are not within the target range, the processor 22 determines that the characteristics are not within the target range.

In the case of NO in step S18, the processor 22 changes the generation condition for generating the pattern data so that the characteristic calculated in step S16 approaches the target range (step S20). Thereafter, the process returns to step S12, and the processor 22 generates pattern data based on the changed generation condition. Thereafter, steps S14, S16 and S18 are executed.

In the case of Yes in step S18, the processor 22 outputs pattern data whose characteristic is within the target range to the output device 28 (step S22). When there is a plurality of pattern data whose characteristics are within the target range, all of the plurality of pattern data within the target range may be output, or the pattern data having the best characteristic among the plurality of pattern data within the target range may be output. Then the process ends.

[Description of Example of Step S10]

Figure 6:
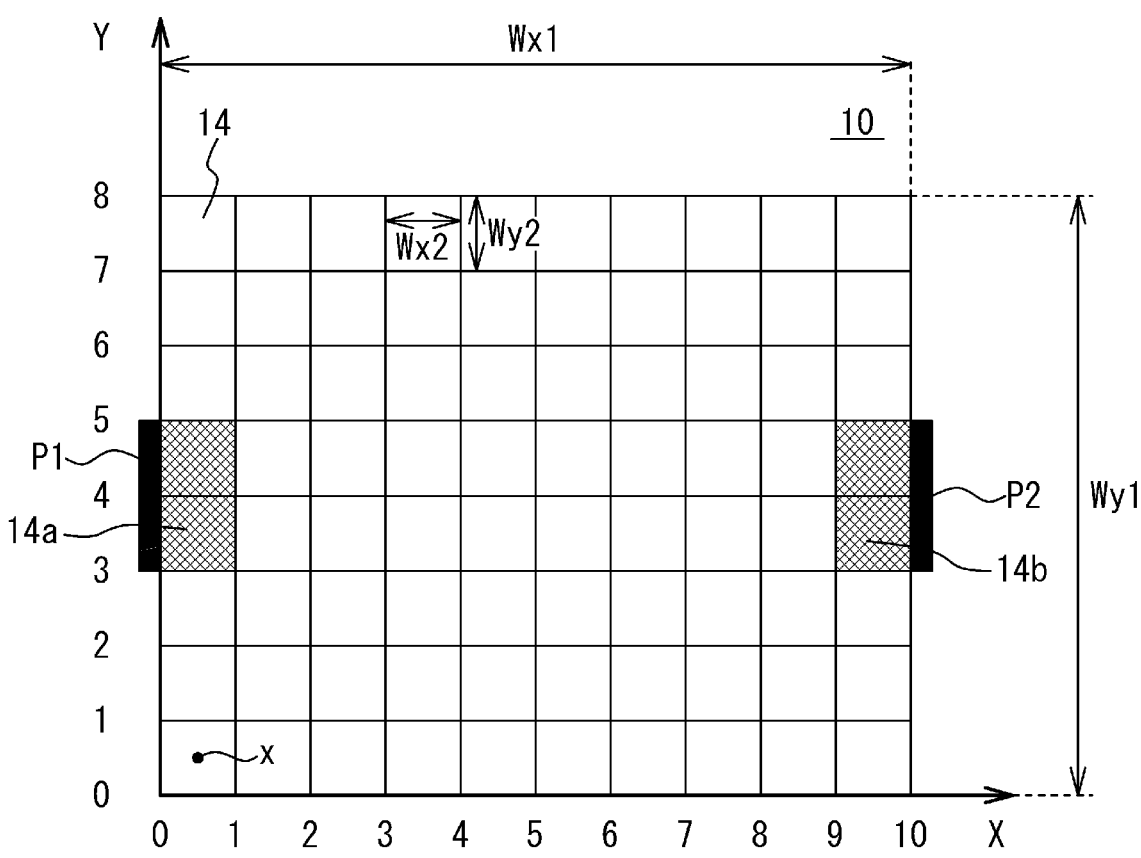
FIG. 6 is a diagram illustrating a surface of the dielectric layer according to the first embodiment.

In step S10, information received by the processor 22 will be described. FIG. 6 is a diagram illustrating a surface of the dielectric layer according to the first embodiment. As illustrated in FIG. 6, the surface 10 of the dielectric layer 32 is divided into a plurality of unit regions 14 having a lattice shape. The planar shape of each unit region 14 is, for example, a rectangle, and is arranged in the X direction and the Y direction.

Widths Wx1 and Wy1 in the X direction and the Y direction on the surface 10 of the dielectric layer 32 are, for example, 10 mm and 8 mm, respectively. For example, the surface 10 is divided into 50 portions in the X direction and 40 portions in the Y direction. The number of the unit regions 14 is 2000, and the widths Wx2 and Wy2 in the X direction and the Y direction in the unit regions 14 are both 0.2 mm. The number of unit regions 14 and the widths Wx1, Wy1, Wx2, and Wy2 can be set freely. In order to design with high accuracy, it is preferable that the number of unit regions 14 in the X direction and the number of unit regions 14 in the Y direction be 10 or more. The number of unit regions 14 and the widths Wx1, Wy1, Wx2 and Wy2 may be received by the processor 22 or may be stored in the memory 24 in advance in step S10.

Parameters used for electromagnetic field analysis include, for example, the frequency of the high-frequency signal, the thickness of the dielectric layer 32, a relative dielectric constant εr and a loss factor tan δ, the material and thickness of the metal layers 34 and 36, an input impedance and an output impedance of the input port P1 and the output port P2. The parameters used for electromagnetic field analysis may be received by the processor 22 or may be stored in the memory 24 in advance in step S10. For example, the frequency of the high-frequency signal is 3.5 GHZ, the thickness of the dielectric layer 32 is 0.2 mm, the relative dielectric constant er is 3.4, the loss factor tan δ is 0.004, the material and thickness of the metal layer 34 are copper and 30 μm, the material and thickness of the metal layer 36 are copper and 0.2 mm, the input impedance of the input port P1 is 50Ω, and the output impedance of the output port P2 is 50Ω. In step S10, the target range of the high-frequency characteristic of the passive element 30 and/or the characteristic of the amplifier circuit 40 may be received by the processor 22 or may be stored in the memory 24 in advance. The target range of the high-frequency characteristic of the passive element 30 is −15 dB or less in S11 and S22, for example.

In FIG. 6, for the sake of simplification, it is assumed that the number of unit regions 14 in the X direction is 10 and the number of unit regions 14 in the Y direction is 8. An X coordinate is normalized by a width Wx2 of the unit region 14 in the X direction, and a Y coordinate is normalized by a width Wy2 of the unit region 14 in the Y direction. The coordinates of a corner on the − side in the X direction and the − side in the Y direction of the unit region 14 of the minimum X and the minimum Y are set to an origin (0, 0). The coordinates of the + side in the X direction and the + side in the Y direction of the unit region 14 of the maximum X and the maximum Y are (10, 8). Each unit region 14 is represented by (1, 1) to (10, 8). The coordinate of the center x of the unit region (1, 1) is (0.5,0.5). The positions of the input port P1 and the output port P2 are indicated by thick lines. The unit regions 14a in contact with the input port P1 are (1, 4) and (1, 5). The unit regions 14b in contact with the output port P2 are (10, 4) and (10, 5). The position information relating to positions of the input port P1 and the output port P2 on the surface 10 may be received by the processor 22 or may be stored in the memory 24 in advance in step S10. The position information may be position coordinates of the unit region 14a in contact with the input port P1 and position coordinates of the unit region 14b in contact with the output port P2.

[Description of Example of Step S12]

Figure 7:
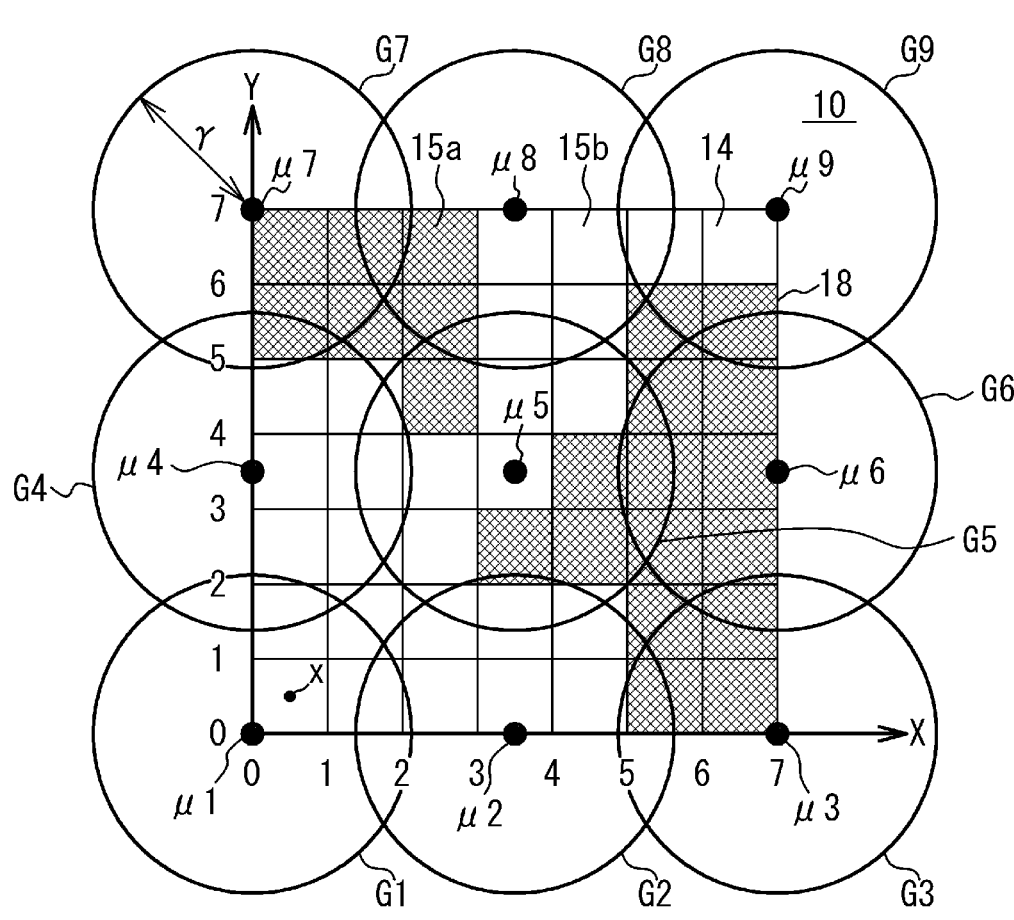
FIG. 7 is a diagram illustrating a method of generating pattern data according to the first embodiment.

In step S12, a method for generating the pattern data by the processor 22 will be described. FIG. 7 is a diagram illustrating the method of generating the pattern data according to the first embodiment. As illustrated in FIG. 7, for the sake of simplicity, a description will be given of 7×7 unit regions 14 as an example. Unit regions (1, 1) to (7, 7) are provided. Assuming that the origin (0, 0) is the − side in the X direction and the − side in the Y direction of the unit region (1, 1), the coordinate of the center x of the unit region (1, 1) is (0.5,0.5). Similarly, the central coordinate of the unit region (7, 7) is (6.5,6.5). A unit region 15*a* in which the pattern 18 is formed is referred to as "iron", and a unit region 15*b* in which the pattern 18 is not formed is referred to as "air". When iron and air are represented by 1 and 0, respectively, the pattern data is data indicating whether each of the unit regions (1, 1) to (7, 7) is iron or air, the pattern data is a 7×7 matrix, and each element is 1 or 0.

Equation 1 is an equation representing a Gaussian basis function.

$$G_n(x) = \frac{\exp\left\{-\frac{1}{2r^2}|x - \mu_n|^2\right\}}{2\pi r^2}$$ [Equation 1]

Where x is a central coordinate of the unit region 14, un is a central coordinate of the Gaussian basis function, and |x−μn|2 is a square of the distance between x and un. The "r" is a radius of the Gaussian basis function. Gn represents the n-th Gaussian basis function among G1 to G9, and Gn(x) represents a value of the Gaussian basis function Gn at the central coordinate x of any unit region 14. As illustrated in Equation 1, the Gaussian basis function Gn(x) has a maximum value at the center un, and gradually approaches 0 as the distance from the center un increases. The Gaussian basis function Gn does not become 0 in a finite range.

In FIG. 7, 9 Gaussian basis functions G1 to G9 are arranged. The coordinates of the centers μ1 to μ9 of the Gaussian basis functions G1 to G9 are (0,0), (3.5, 0), (7, 0), (0, 3.5), (3.5, 3.5), (7, 3.5), (0, 7), (3.5, 7) and (7,7), respectively. The center un of the Gaussian basis function Gn may be located at the corner, side, center or other position of the unit region 14. The number and position of the Gaussian basis functions Gn can be set freely. Although the radius r can be set freely, it is preferable that a circle having a radius r centered on un overlaps a part of adjacent Gaussian basis functions Gn.

When 50×40 unit regions 14 are arranged as in the above example, for example, 11×9 Gaussian basis functions are arranged. The radius r of the Gaussian basis function Gn is, for example, 0.8 mm. The coordinates of the center un and radius r of the Gaussian basis function Gn may be received by the processor 22 or may be stored in the memory 24 in advance in step S10.

Figure 8:
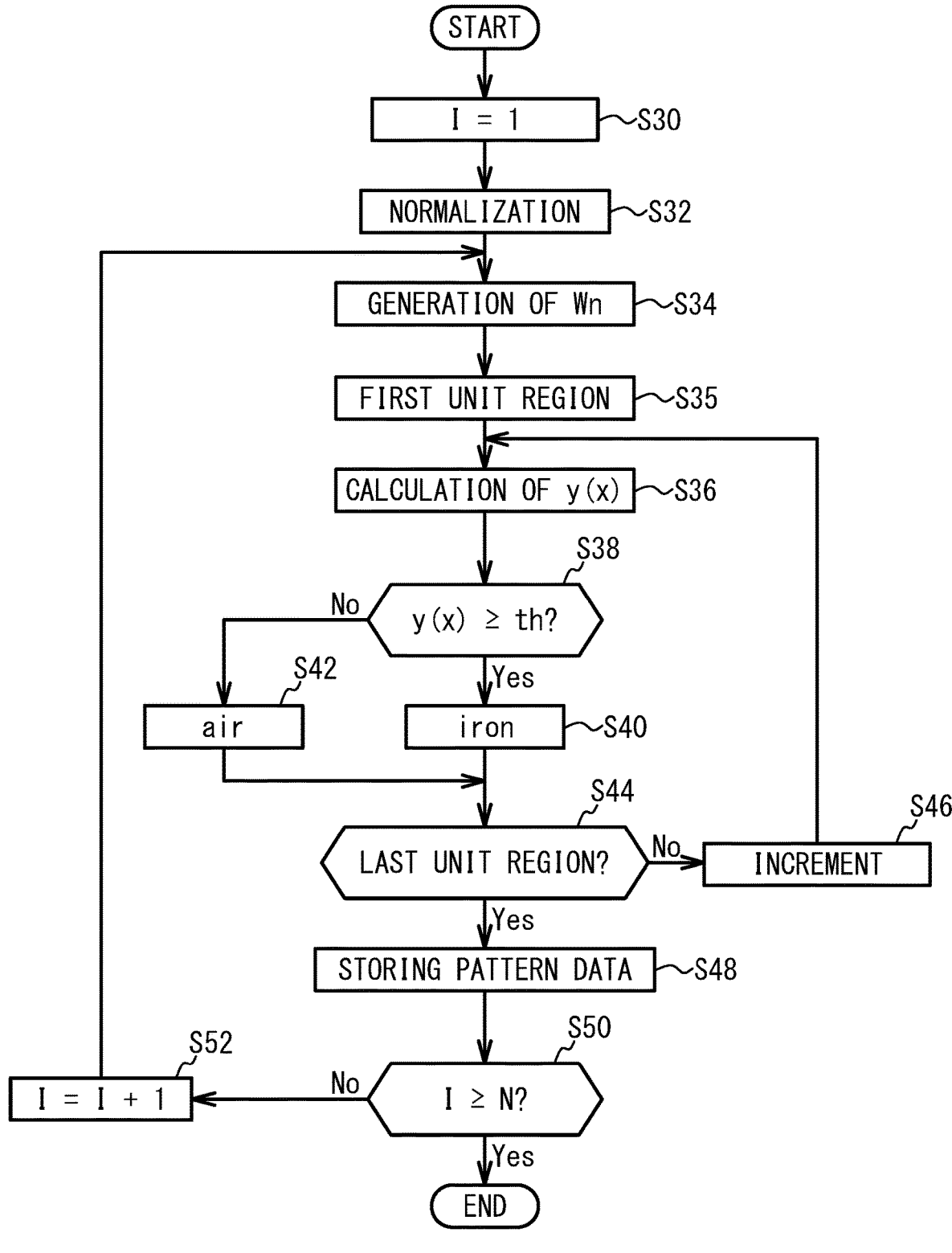
FIG. 8 is a flowchart illustrating a method of generating the pattern data according to the first embodiment.

FIG. 8 is a flowchart illustrating a method of generating the pattern data according to the first embodiment. N is the generation number of pattern data. N=1 is satisfied when only one pattern data is generated, and N≥2 is satisfied when a plurality of pattern data are generated. I is a variable for counting the generation number of pattern data. First, the processor 22 sets 1 to the variable I, i.e., I=1 (step S30). The processor 22 normalizes the Gaussian basis function (step S32). The normalization of the Gaussian basis function will be described by taking the generation of the pattern in each unit region 14 as an example of the unit region (1, 1). The processor 22 normalizes the Gaussian basis function Gn(x) at the center x of the unit region (1, 1). Equation 2 represents a normalized Gaussian basis function Gn' (for example, G1' to G9').

$$G_n'(x) = \frac{G_n(x)}{\sum_k G_k(x)}$$ [Equation 2]

The denominator on the right side is the sum of the Gaussian basis functions Gn (for example, G1 to G9) at the center x of the unit region (1, 1).

The processor 22 randomly generates weights Wn (for example, W1 to W9) of the Gaussian basis functions Gn (for example, G1 to G9) based on the generation conditions (step S34). The range of the weight Wn is, for example, −1≤Wn≤1. The counter of the unit region 14 is set to the first unit region (1, 1) (step S35).

The processor 22 calculates a sum (for example, the sum of n=1 to 9) of a product Wn×Gn'(x) of the weight Wn generated in step S34 and the standardized Gaussian basis function Gn'(x) at the center x of the unit region (1, 1) (step S36). Equation 3 represents a sum y (x) of the weighted Gaussian basis functions Wn×Gn'(x).

$$y(x) = \sum W_n G_n'(x)$$ [Equation 3]

The processor 22 determines whether the calculated y(x) is equal to or greater than a threshold th (step S38). The threshold th is, for example, 0. When y (x) is equal to or greater than the threshold th, the processor 22 determines that the unit region (1, 1) is "iron" (step S40) and generate a pattern in the unit region (1, 1). When y (x) is smaller than the threshold th, the processor 22 determines that the unit region (1, 1) is "air" (step S42) and does not generate a pattern in the unit region (1, 1). The processor 22 sets the element of the pattern data corresponding to the unit region (1, 1) to 1 in the case of "iron", and 0 in the case of "air".

The processor 22 determines whether it is the last unit region 14 (step S44). If step S34 is NO, the processor 22 increments the unit region 14 (step S46). For example, the unit region is (2, 1). The process returns to step S36 and the processor 22 executes steps S36 to S44. Thus, the element of the pattern data corresponding to the unit region (2, 1) becomes 1 or 0. Thereafter, the processor 22 similarly determines whether the remaining unit regions (3, 1) to (7, 7) are "iron" or "air", and generates the pattern data.

If step S44 is YES (for example, in the case of the unit region (7, 7)), the processor 22 stores the generated pattern data in the memory 24 (step S48).

The processor 22 determines whether I is equal to or greater than N (I≥N) (step S50). If step S50 is No, the processor 22 increments I by 1 (I=I+1) (step S52), and the process returns to step S34. In steps S34 to S48, the pattern data is generated. When step S50 is YES, the process ends. As a result, N pieces of pattern data different from each other are generated.

In step S34, the weight Wn is randomly generated based on the generation condition to form the pattern 18. When a certain weight Wk (for example, k is 1 to 9) is set to 1, the pattern 18 is easily generated in the unit region 14 near μk. When Wk is set to −1, the pattern 18 is less likely to be formed in the unit region 14 near μk. When all Wn's are randomly generated between −1 and +1, the pattern 18 has a random shape. When a possible range of the weight Wn is provided, a bias is added to the generation of the pattern 18. For example, when a generation condition that fixes Wk to a specific numerical value within −1 to +1 such as +1, 0, or −1 or a generation condition that limits the range that Wk can take to a specific range within −1 to +1 such as generating Wk in the range of +0.5 to +1 is determined, the pattern 18 is easily formed near μk (for example, near the unit region (4, 4) when k=5). As the generation condition, in addition to the generation condition for determining the range in which the weight Wn is generated, a well-known method such as a method of changing the probability of occurrence (for example, the probability of occurrence of −1.0 to 0 as Wk is doubled as the probability of occurrence of 0 to +1.0) can be used. In this way, the pattern 18 close to the desired pattern can be randomly generated by determining the generation conditions of the plurality of weights Wn.

[Description of Example of Step S14]

Figure 9:
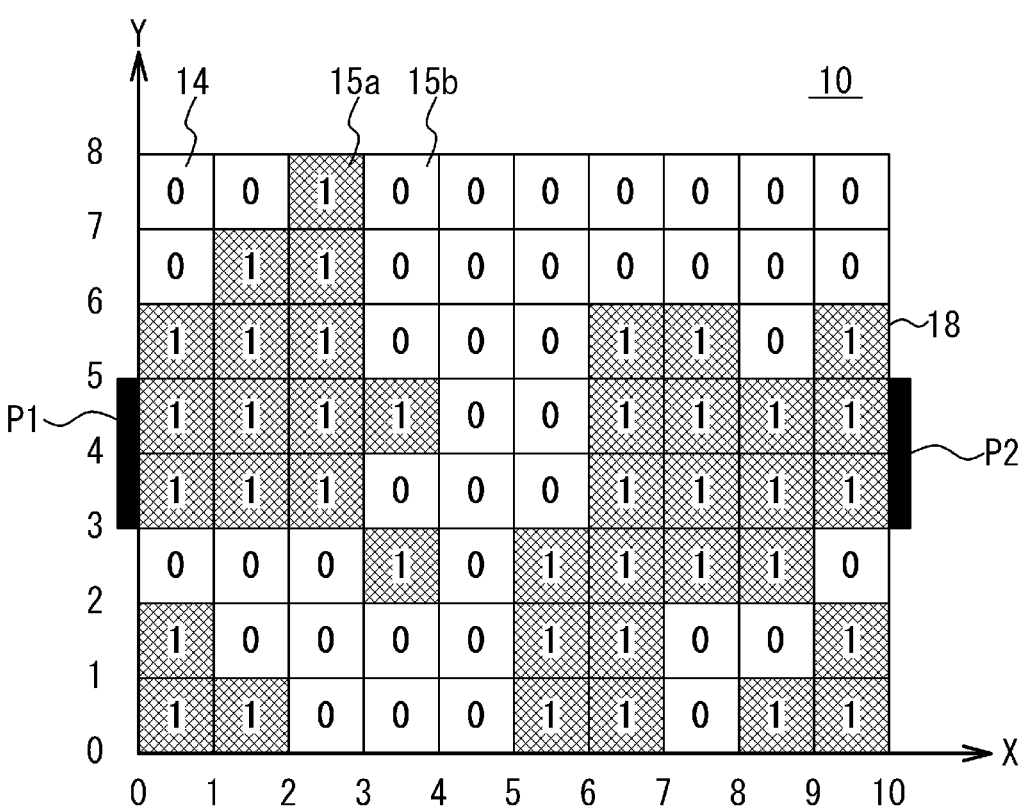
FIG. 9 is a diagram illustrating an example of the pattern data generated in step S12 according to the first embodiment.
Figure 10:
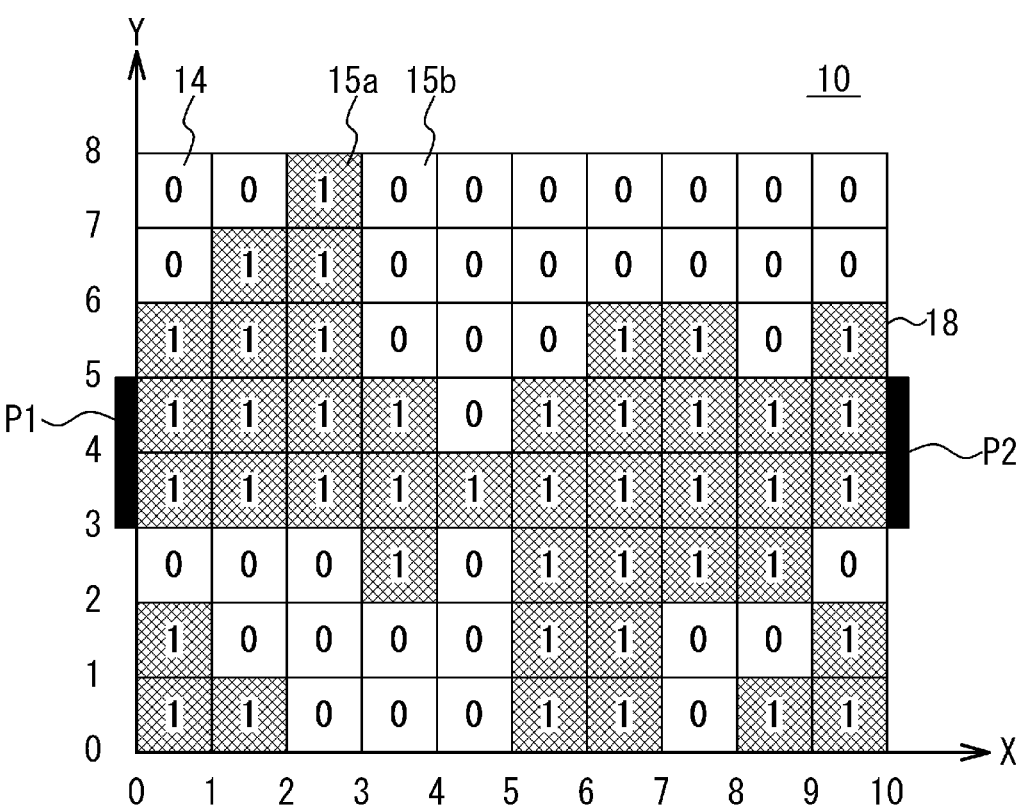
FIG. 10 is a diagram illustrating an example of the pattern data generated in step S12 according to the first embodiment.

FIGS. 9 and 10 are diagrams illustrating examples of pattern data D1 and D2 generated in step S12 according to the first embodiment. In FIGS. 9 and 10, the surface 10 is divided into 10×8 unit regions 14. "0" and "1" in the unit region 14 indicate elements of the pattern data D1 and D2. The elements of the pattern data D1 and D2 corresponding to the unit region 15a in which the pattern 18 is formed are 1, and the elements of the pattern data D1 and D2 corresponding to the unit region 15b in which the pattern 18 is not formed are 0. In the pattern data D1 of FIG. 9, the input port P1 and the output port P2 are not physically connected via the pattern 18. In the pattern data D2 of FIG. 10, the input port P1 and the output port P2 are physically connected via the pattern 18.

When the predetermined condition in step S14 is "the input port P1 and the output port P2 are physically connected via the pattern 18", the processor 22 determines No for the pattern data D1 and Yes for the pattern data D2 in step S14.

In step S14, a method for determining whether the input port P1 and the output port P2 are physically connected via the pattern 18 will be described.

Figure 11:
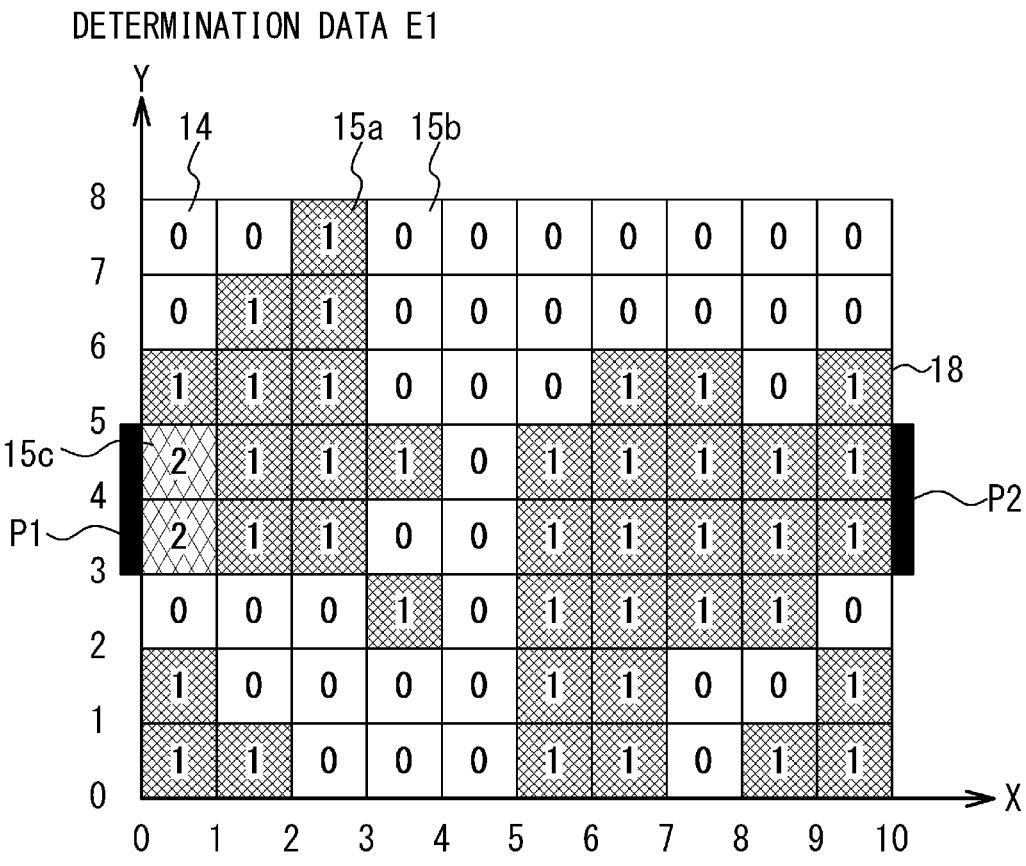
FIG. 11 is a diagram illustrating an example of determination data used in step S14 according to the first embodiment.
Figure 12:
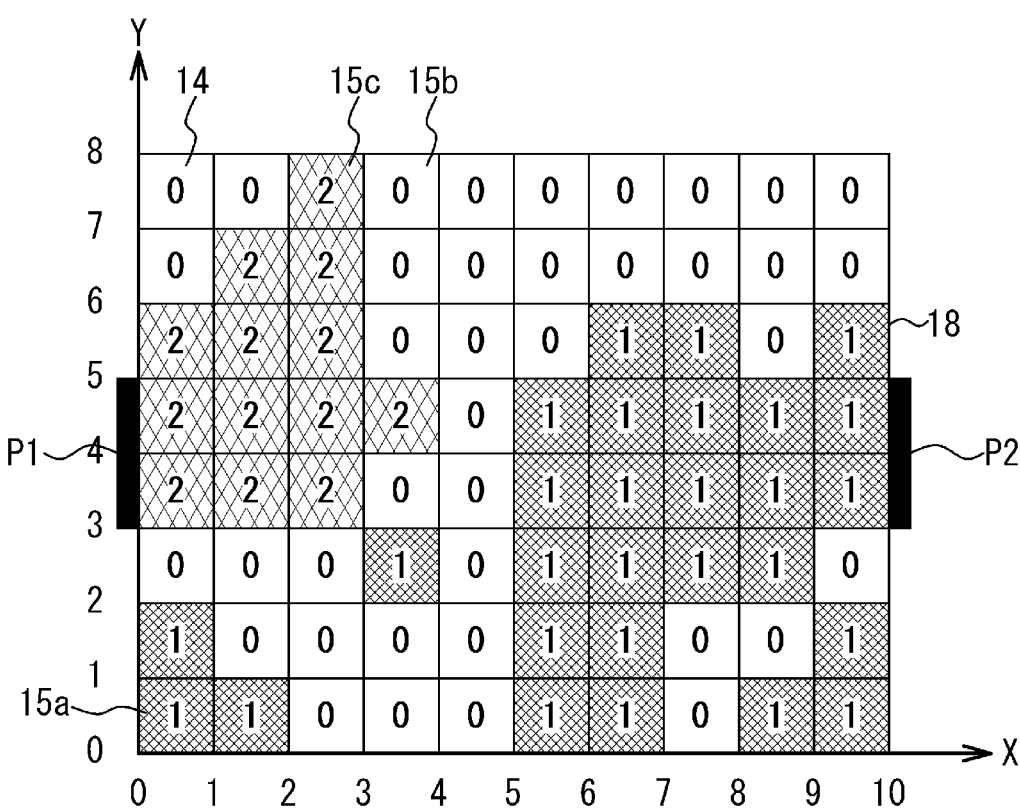
FIG. 12 is a diagram illustrating an example of determination data used in step S14 according to the first embodiment.

First, the pattern data D1 will be described as an example. FIGS. 11 and 12 are diagrams illustrating examples of the determination data E1 used in step S14 according to the first embodiment. The determination data E1 is data obtained by copying the pattern data D1 onto another sheet. The determination data E1 is a matrix having the same number of rows and columns as the pattern data D1, and each element may take 2, 3 or the like in addition to 0 and 1.

As illustrated in FIG. 11, the processor 22 determines whether the element of the determination data E1 corresponding to the unit region 14 (for example, (1, 4) and (1, 5)) in contact with the input port P1 is 1 or 0. When the element of the determination data E1 corresponding to the unit regions (1, 4) and/or (1, 5) is 1, the processor 22 sets the element of the determination data E1 corresponding to the corresponding unit regions (1, 4) and/or (1, 5) to 2. The processor 22 determines whether the unit regions adjacent in the X direction and the Y direction to the unit regions (1, 4) and/or (1, 5) having the element of 2 in the determination data E1 are 1. For example, in the case of the unit region (1, 4), since there is no unit region in contact with the − side in the X direction, the processor 22 determines whether the elements of the determination data E1 corresponding to the unit regions (1, 3), (1, 5), and (2, 4) are 1. Since the element of the determination data E1 corresponding to the unit region (2, 4) is 1, the processor 22 sets 2 to the element of the determination data E1 corresponding to the unit region (2, 4). The processor 22 repeats this operation.

As illustrated in FIG. 12, the unit region 14 physically connected to the input port P1 via the pattern 18 becomes a unit region 15c, and the element of the corresponding determination data E1 becomes 2. After the unit region (4, 5) is set to 2, all of the unit regions (5, 5), (4, 4) and (4, 6) which are in contact with the unit region (4, 5) in the X direction and the Y direction are 0. Therefore, there is no further unit region 14 in which the element of the determination data E1 is 2. When there is no unit region 14 in which the element of the determination data E1 is 2, the elements of the determination data of the unit regions (10, 4) and (10, 5) in contact with the output port P2 are 1. When none of the unit regions (10, 4) and (10, 5) in contact with the output port P2 is 2, the processor 22 determines No in step S14.

Figure 13:
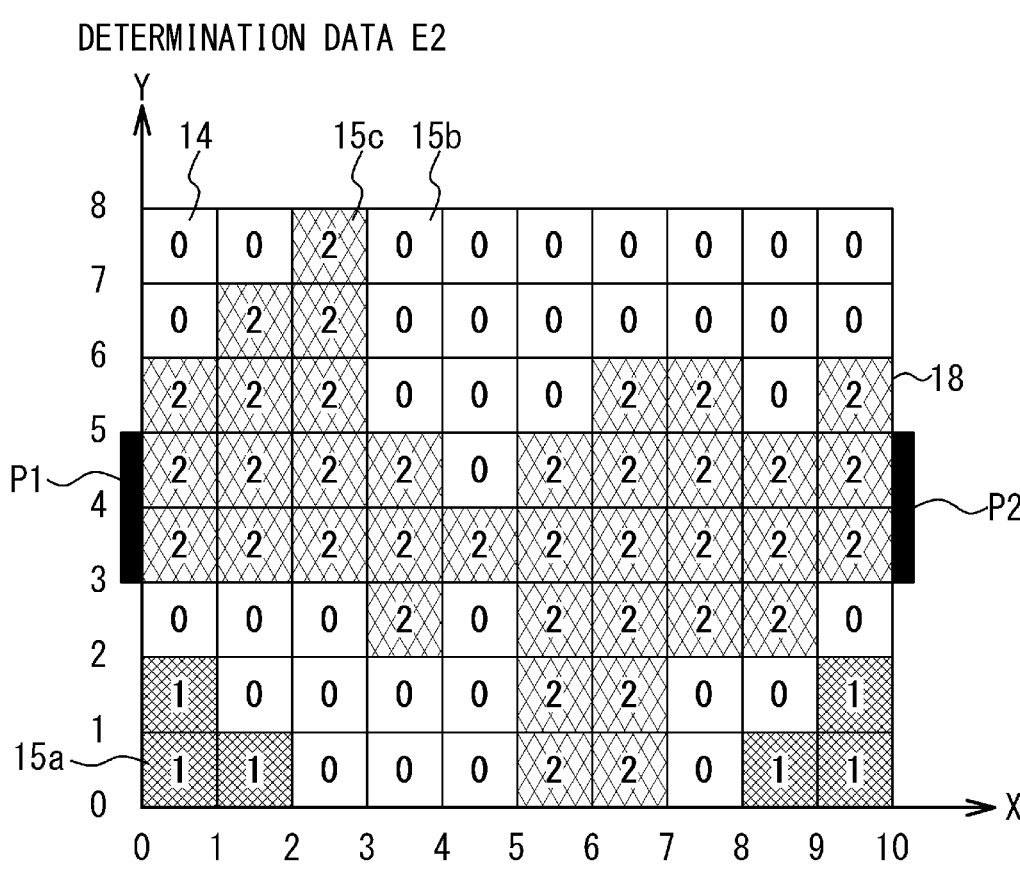
FIG. 13 is a diagram illustrating an example of determination data used in step S14 according to the first embodiment.

Next, the pattern data D2 will be described as an example. FIG. 13 is a diagram illustrating an example of the determination data E2 used in step S14 according to the first embodiment. The determination data E2 is data obtained by copying the pattern data D2 to another sheet. As illustrated in FIG. 13, operations similar to those of FIGS. 11 and 12 are carried out. When there is no unit region 14 in which the element of the determination data E2 is 2, the elements of the determination data E2 of the unit regions (10, 4) and (10, 5) in contact with the output port P2 become 2. When at least one of the unit regions (10, 4) and (10, 5) in contact with the output port P2 is 2, the processor 22 determines Yes in step S14. As described above, the processor 22 can determine whether the input port P1 and the output port P2 are physically connected via the pattern 18. Processing as illustrated in FIGS. 11 to 13 may be performed using commands such as floodFill in a language such as python or C+.

The predetermined condition in step S14 may be other than a case where "the input port P1 and the output port P2 are physically connected via the pattern 18". For example, the predetermined condition may be that "there is no unit region 15a of iron other than a pattern for connecting the input port P1 and the output port P2" or that "there is no unit region 15a of iron more than a certain distance from a pattern for physically connecting the input port P1 and the output port P2". In step S16, the predetermined condition may be that "Not pattern data that does not require electromagnetic field analysis (for example, high-frequency characteristics cannot be calculated)". [Description of Example of Step S16]

In step S16, it is assumed that the pattern data determined to be Yes in step S14 is for the passive element 30 as illustrated in FIGS. 1 and 2. The processor 22 performs three dimensional electromagnetic field analysis of the passive element 30 using, for example, the finite element method when the high-frequency signal is input to the input port P1 and is output from the output port P2. In the three dimensional electromagnetic field analysis using the finite element method, the passive element 30 is divided into three dimensional meshes, and when the high-frequency signal is inputted to the input port P1, an electric field and a magnetic field with respect to time in each mesh in the passive element 30 are obtained by solving Maxwell's equation, and the high-frequency characteristic of the passive element 30 or the characteristic of the pattern 18 is calculated. The high-frequency characteristic to be calculated is, for example, an S-parameter or an impedance, and the characteristic of the pattern 18 is, for example, a current and/or a voltage in the pattern 18, or a strength of an electric field and/or a magnetic field in the pattern 18. When the target is the high-frequency characteristic of the passive element 30 or the characteristic of the pattern 18, step S16 ends by calculating the high-frequency characteristic of the passive element 30 or the characteristic of the pattern 18.

When the target is the characteristic of the electronic circuit including the passive element 30, the processor 22 calculates the characteristic of the electronic circuit using the calculated high-frequency characteristic of the passive element 30. For example, when the passive element 30 is used as the matching circuit 46 of the amplifier circuit 40 illustrated in FIG. 3 and the target is the characteristic of the amplifier circuit 40, the calculated high-frequency characteristic (for example, S-parameter) of the passive element 30 is taken as the high-frequency characteristic of the matching circuit 46 to calculate the characteristic of the amplifier circuit 40. Thus, step S16 ends.

[Description of Example of Step S18]

When the target characteristic is the S parameter of the passive element 30, the target range of the S parameter is, for example, the range of S11, S12, S21 and/or S22 on the Smith chart or the range of the absolute value of S11, S12, S21 and/or S22. When the target characteristic is the impedance of the passive element 30, the target range of the impedance is, for example, a range on a Smith chart of the impedance of the pattern seen from the input port P1 and/or the impedance of the pattern 18 seen from the output port P2, or a range of the absolute value of the impedance. When the target characteristic is the current and/or voltage in the passive element 30, the range of the current and/or voltage is, for example, a magnitude of a current component and/or voltage component at a characteristic location in the pattern 18, a maximum current density in the pattern 18, or the like. When the target characteristic is the electric field and/or the magnetic field in the passive element 30, the range of the electric field and/or the magnetic field is, for example, a range of a magnitude of an electric field and/or a magnetic field at a specific location inside or outside the passive element 30. When the target characteristic is the characteristic of the amplifier circuit 40, the range of the characteristic of the amplifier circuit 40 is, for example, a range of an efficiency, a distortion characteristic and/or a power characteristic of the amplifier circuit 40.

[Description of Example of Step S20]

In step S20, the generation condition for generating the pattern data in step S12 is changed. For example, in step S34 of FIG. 8, the generation condition used for generating the plurality of weights Wn is changed. The generation condition of the weight Wn may be set for each Wn. Based on the past pattern data stored in the memory 24 and the characteristics associated with the pattern data, the processor 22 may set the characteristics as an objective function and optimize the generation conditions of the plurality of weights Wn so that the objective function approaches the target range. As an optimization method, a gradient method such as a Newton method or machine learning may be used.

[Description of Example of Step S22]

Figure 14:
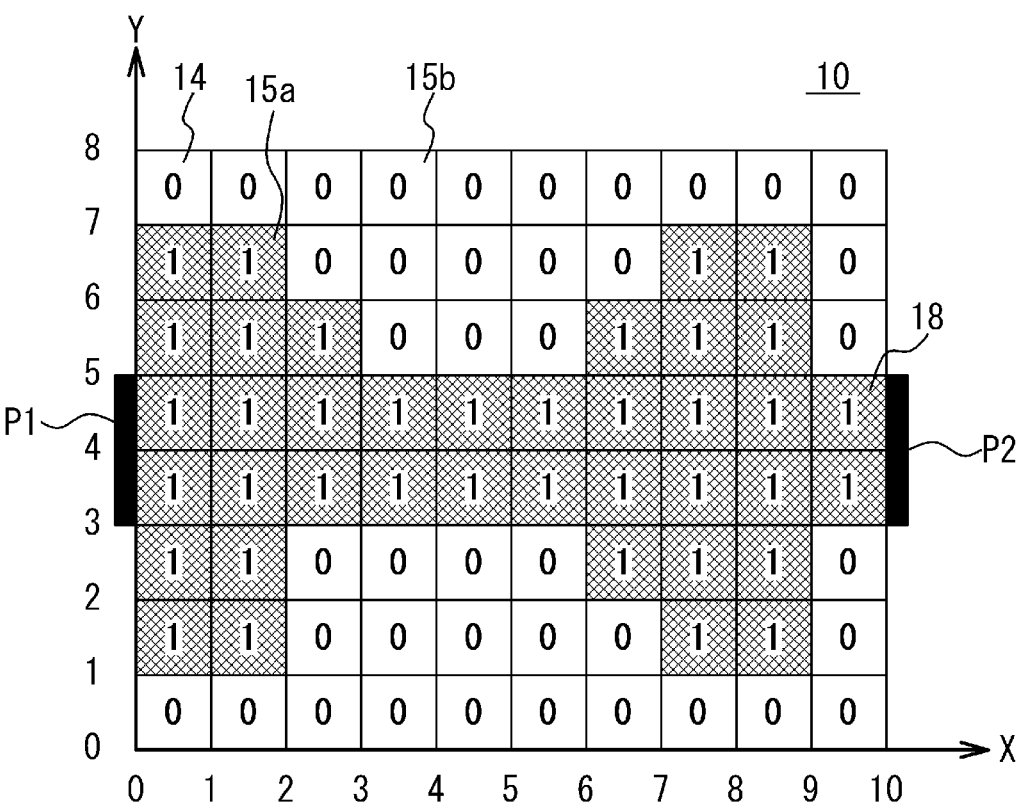
FIG. 14 is a diagram illustrating an example of pattern data output in step S22 according to the first embodiment.

FIG. 14 is a diagram illustrating an example of pattern data D3 output in step S22 according to the first embodiment. When the characteristic is calculated in step S16 using the pattern data D3 illustrated in FIG. 14, it is determined in step S18 that the calculated characteristic is within the target range. As illustrated in FIG. 14, the input port P1 and the output port P2 are physically connected via the pattern 18. In step S22, the processor 22 outputs the pattern data D3 illustrated in FIG. 14 to an external device (a computer, a display device, or a printer).

As a comparative example, when step S14 of FIG. 5 is not provided, a characteristic is calculated in step S16 for the pattern data generated in step S12. However, the calculation of electromagnetic field analysis takes time. For example, it may take more than one second to perform electromagnetic field analysis on one pattern data. On the other hand, in step S12, even if, for example, 1000 or more pieces of pattern data are generated, a time of 0.1 seconds or less is sufficient for generation of pattern data. The pattern data generated in step S12 includes many pattern data which is meaningless even if subjected to electromagnetic field analysis in step S16. When electromagnetic field analysis is performed on such pattern data, a load on the computer 20 becomes large.

According to the first embodiment, in step S12 of FIG. 5, pattern data corresponding to the pattern 18 of the metal layer provided on the surface 10 of the dielectric layer 32 is generated based on the generation conditions. As in step S14, it is determined whether the generated pattern data satisfies the predetermined condition. When it is determined that the predetermined condition is not satisfied, the process returns to step S12 for generating pattern data. As in step S16, when it is determined that the predetermined condition is satisfied, electromagnetic field analysis is performed based on the pattern data, thereby calculating the characteristics of the pattern 18 or the element or circuit having the pattern 18 when the high-frequency signal is inputted to the input port P1 (a first portion of the pattern 18) and the high-frequency signal is outputted from the output port P2 (a second portion of the pattern 18). As in step S18, it is determined whether the characteristic of the calculated pattern 18 or the element or circuit having the pattern 18 is within the target range. As in step S20, when it is determined that the calculated characteristic is not within the target range, the generation condition for generating pattern data is changed. Thereafter, the process returns to step S12. As described above, when the pattern data does not satisfy the predetermined condition, the electromagnetic field analysis is not executed, and when the pattern data satisfies the predetermined condition, the electromagnetic field analysis is executed. Thus, for example, in the case where the input port P1 and the output port P2 are not physically connected via the pattern 18, the electromagnetic field analysis is not performed for the pattern data which obviously does not fall within the target range in step S18, so that the load on the computer 20 can be suppressed and the pattern can be efficiently optimized. The element for calculating the characteristic may be the passive element 30 as in the first and second embodiments, or may be another element. The circuit for calculating the characteristic may be the amplifier circuit 40 or another circuit.

The change of the generation condition of the pattern data in step S20 is carried out so that the characteristic of the pattern 18 or the element or circuit having the pattern 18, which is calculated based on the pattern data generated based on the changed generation condition, approaches the target range. Thus, in step S14, pattern data that is more likely to satisfy the target range can be generated.

In step S12, as in step S34 of FIG. 8, a plurality of weights Wn associated with a plurality of positions on the surface 10 are generated. As in steps S36 to S48, pattern data is generated based on the generated plurality of weights Wn. At this time, the generation condition of the pattern data changed in step S20 is a condition for generating the plurality of weights Wn in step S34. As described above, the generation condition of the pattern data can be changed by changing the generation condition of the weight Wn. The generation condition of the pattern data may be a condition other than the generation condition of the weight Wn.

In step S34, a plurality of weights Wn are randomly generated within a range of weights Wn (for example, a range of each of the plurality of weights Wn). In step S20, the range in which the weight Wn is randomly generated in step S34 is changed, and the process returns to step S12. The range in which weights Wn are randomly generated is changed so that the characteristic of the pattern 18, the element or the circuit calculated based on pattern data generated based on the plurality of weights Wn randomly generated within the range of the plurality of weights Wn to be changed approaches the target range. Thus, in step S14, it is possible to generate pattern data that is more likely to satisfy the target range.

For pattern data in which the input port P1 and the output port P2 are not physically connected via the pattern 18, desired characteristic cannot be obtained even if the electromagnetic field analysis is performed in step S16. Therefore, the predetermined condition in step S14 is that the input port P1 and the output port P2 are physically connected via the pattern 18. As a result, it is unnecessary to perform the electromagnetic field analysis on pattern data which does not need to perform the electromagnetic field analysis, and pattern optimization can be performed efficiently.

In step S12, a plurality of different pattern data are generated. In step S14, when at least one of the plurality of pattern data satisfies the predetermined condition, it is determined that the predetermined condition is satisfied, and when all of the plurality of pattern data do not satisfy the predetermined condition, it is determined that the predetermined condition is not satisfied. Thus, since the plurality of pattern data are generated at one time in step S12, the pattern can be optimized more efficiently.

In step S12, the number of pattern data to be generated at one time may be changed based on the number of pattern data satisfying the predetermined condition in step S14. For example, when there are many pattern data satisfying the predetermined condition in step S14, the number of pattern data to be generated at one time in step S12 may be reduced, and when there are few pattern data satisfying the predetermined condition in step S14 (for example, 0), the number of pattern data to be generated at one time in step S12 may be increased.

In step S12, as in step S36 of FIG. 8, the processor 22 calculates a plurality of functions Gn. Each of the plurality of functions Gn has a position in the surface 10 (for example, a position at the center x of the unit region 14) as a variable, is related to each of a plurality of positions (for example, a position at the center un), and has each of a plurality of weights Wn. As in steps S38 to S40, the processor 22 generates the pattern 18 in the corresponding unit region 14 when the integrated value y(x) of the plurality of functions Gn in the corresponding unit region 14 is within the predetermined range (for example, th≥0) for each of the plurality of unit regions 14 in which the surface 10 is divided, and does not generate the pattern 18 in the corresponding unit region 14 when the integrated value y (x) is not within the predetermined range. Thus, pattern data can be generated based on the weight Wn. The predetermined range may be equal to or greater than a certain threshold th as in step S38, or may be smaller than the threshold th.

Although the Gaussian basis function centered at a plurality of positions has been described as an example of the plurality of functions, the plurality of functions may be functions other than the Gaussian basis function. The plurality of functions are preferably local maxima or minima at the center un, gradually approach 0 away from un, and are not 0 in a finite range.

Second Embodiment

Figure 15:
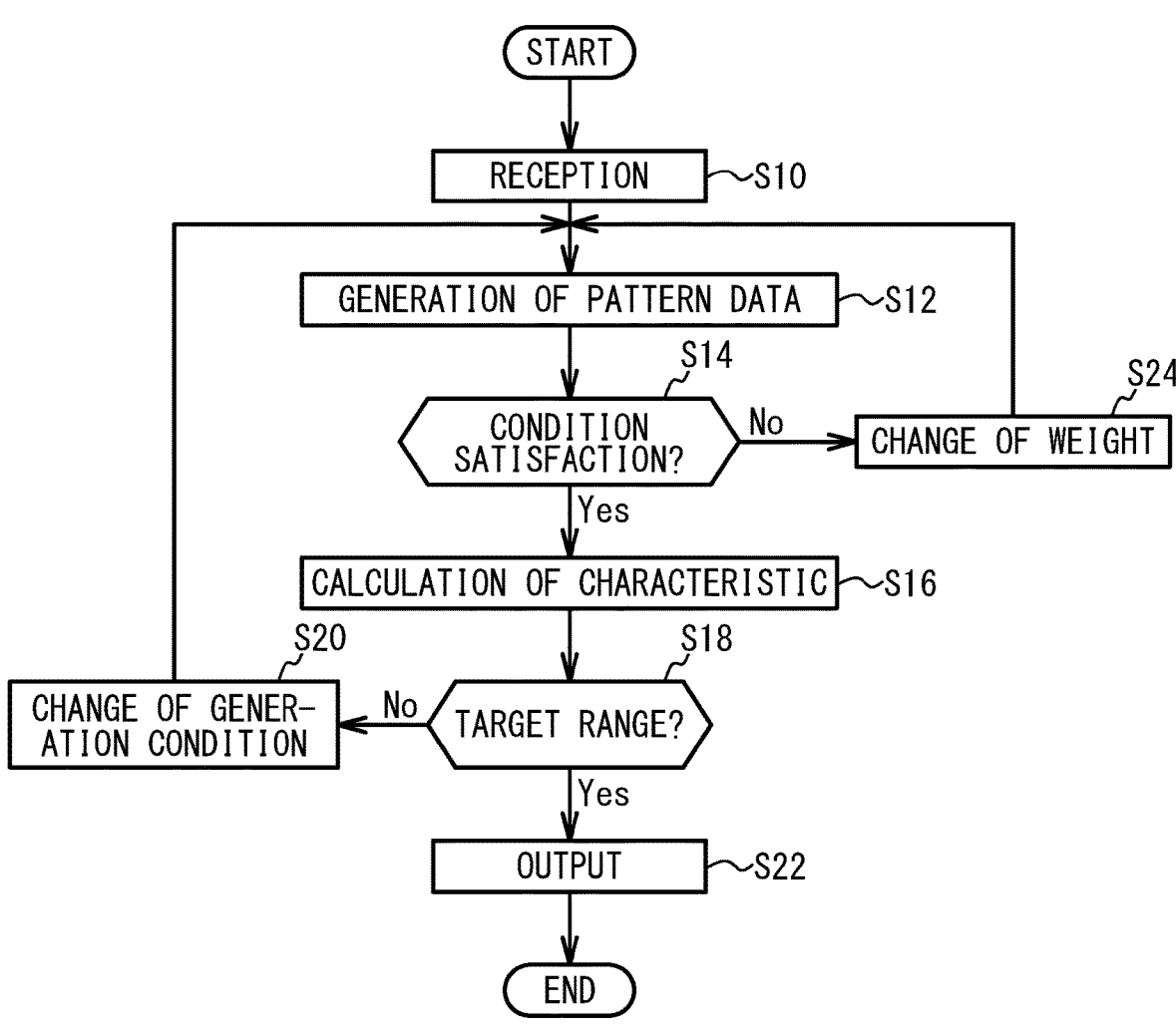
FIG. 15 is a flowchart illustrating processing of the computer according to a second embodiment.

FIG. 15 is a flowchart illustrating the processing of the computer according to a second embodiment. As illustrated in FIG. 15, in the case of No in step S14, the processor 22 changes the generation condition of the plurality of weights so that the pattern data approaches the predetermined condition in step S24 (step S24). Thereafter, the process returns to step S12, and the processor 22 generates pattern data based on the changed generation condition. Other configurations are the same as those of the first embodiment, and description thereof is omitted.

[Description of Example of Step S24]

In step S24, the generation condition of the weight Wn when the weight Wn is generated in step S34 of FIG. 8 is changed. As the generation condition of the weight Wn, for example, a range of Wn in which the weight Wn can be generated is set for each Wn (W1 to W9). The processor 22 may optimize the generation conditions of the plurality of weights Wn so that the characteristic is an objective function and the objective function approaches the characteristic of the predetermined condition based on the past pattern data stored in the memory 24 and the characteristic of the pattern data associated with the pattern data. As an optimization method, a gradient method such as a Newton method or machine learning may be used.

Figure 16:
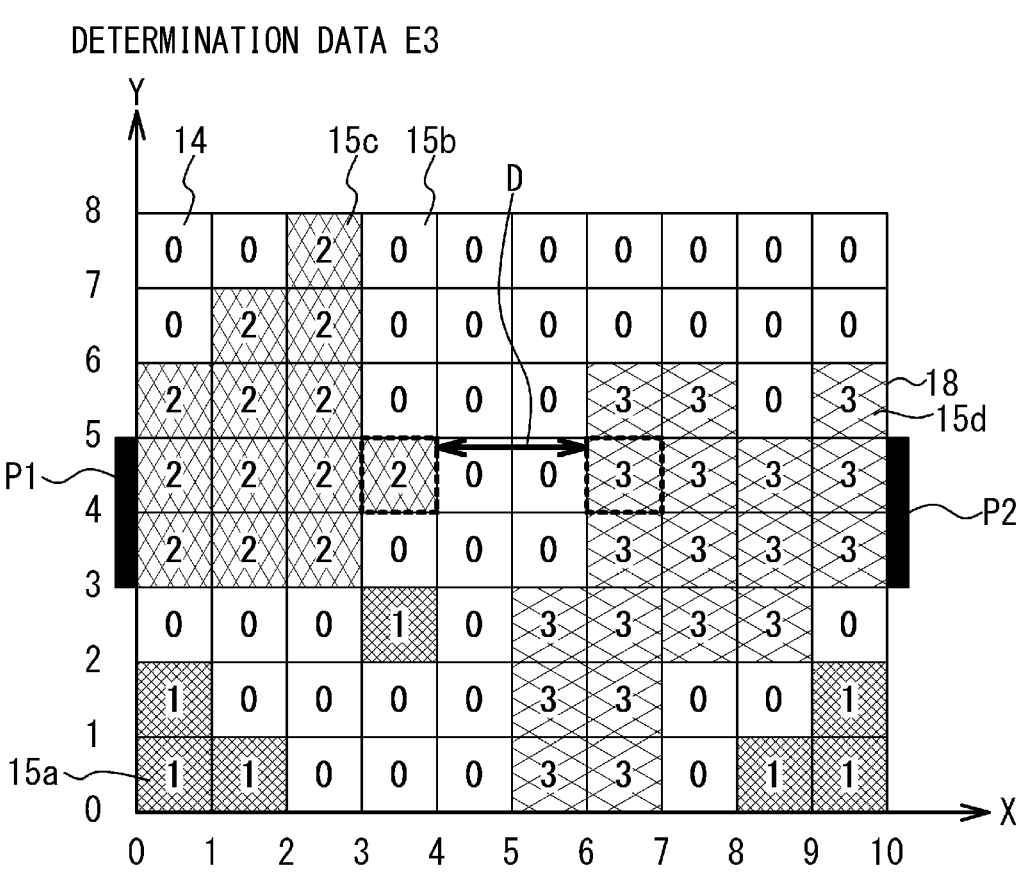
FIG. 16 is a diagram illustrating an example of determination data used in step S14 according to the second embodiment.

In step S24, an example of pattern data as the objective function will be described. FIG. 16 is a diagram illustrating an example of determination data E3 used in step S14 according to the second embodiment. The determination data E3 is data obtained by copying the pattern data D1 onto another sheet. As illustrated in FIG. 16, when the unit region 14 in which the element of the determination data E3 is "2" does not exist anymore in step S14 as illustrated in FIG. 12, the processor 22 sets "3" to the element of the determination data E3 corresponding to a unit region 15d connected to the unit region 14 (for example (10, 4) and (10, 5)) in contact with the output port P2. Similarly to the generation of the unit region 15c in which the element of the determination data E3 is 2, the unit region 15d in which the element of the determination data E3 is 3 is generated. When there is no further unit region 14 in which the element of the determination data E2 is 3, the processor 22 calculates a minimum distance between the unit regions 15c and 15d. In FIG. 16, a distance D between the unit regions (4, 5) and (7, 5) is minimum. Therefore, the pattern data D1 is characterized by the distance D.

In step S24, the processor 22 takes the distance D as the objective function and optimizes the generation conditions of the plurality of weights Wn so that the objective function becomes small. Thus, in step S12, the pattern data is generated so that the distance D becomes small. Further, the processor 22 may change the generation condition of the weight Wn so that the weight of the Gaussian basis function centered around the unit regions (5, 5) and (6, 5) between the unit regions (4, 5) and (7, 5) approaches 1.

According to the second embodiment, when it is determined No in step S14 of FIG. 15, the generation condition of the pattern data is changed so that the pattern data generated based on the changed generation condition approaches the predetermined condition as in step S24, and the process returns to step S12. Thus, in step S12, the pattern data is generated so as to satisfy the predetermined condition. Therefore, the pattern can be efficiently optimized.

When the predetermined condition is that the input port P1 and the output port P2 are physically connected via the pattern 18, in step S24, the generation condition is changed so that the minimum distance D between the pattern connected to the input port P1 (the pattern of the unit region 15c) and the pattern connected to the output port P2 (the pattern of the unit region 15d) in the pattern data generated based on the changed generation condition becomes small. Thus, in step S12, the pattern data is generated so that the distance D becomes small, and the probability of generating the pattern data in which the input port P1 and the output port P2 are physically connected via the pattern 18 increases. Therefore, the pattern can be efficiently optimized.

In the first and second embodiments, in FIGS. 5 and 15, most of the pattern data generated in step S12 does not satisfy the predetermined condition in step S14 in an initial stage. When the loop from step S18 to step S12 is repeated, most of the pattern data generated in step S12 satisfies the predetermined condition in step S14. Thus, when most of the pattern data generated in step S12 satisfies the predetermined condition in step S14, step S14 does not have to be performed.

The present disclosure can be realized not only as a pattern generation device including such a characteristic processor 22 (processing unit), but also as a pattern generation method using such a characteristic process as steps, or as a program for causing a computer to execute such steps. Further, it can be realized as a semiconductor integrated circuit realizing a part or all of a pattern generation device, or as a pattern generating system including the pattern generation device.

At least parts of the above embodiments may be freely combined. The pattern generation device comprises a computer, and each function of the pattern generation device is exhibited when a computer program stored in a storage device of the computer is executed by the CPU of the computer. The computer program may be stored on a non-temporary tangible storage medium such as a CD-ROM.

It should be understood that the embodiments disclosed herein are illustrative and non-restrictive in every respect. The scope of the present disclosure is defined not by the meaning described above but by the claims, and is intended to include all modifications within the meaning and scope equivalent to the claims.

What is claimed is:

1. A pattern generation device comprising:
a memory; and
a processor coupled to the memory, the processor being configured to:
generate pattern data corresponding to a pattern of a metal layer provided on a surface of a dielectric layer based on a generation condition;
determine whether the generated pattern data satisfies a predetermined condition, wherein determining whether the generated pattern data satisfies the predetermined condition comprises: (i) identifying connected regions of the pattern represented by the pattern data by executing a connected-component labeling operation; and (ii) determining that the predetermined condition is satisfied when a first portion of the pattern and a second portion of the pattern are included in a same labeled connected region;
return to generate the pattern data when it is determined that the predetermined condition is not satisfied;
calculate a characteristic of the pattern or an element or circuit having the pattern when a high-frequency signal is inputted to the first portion of the pattern and a high-frequency signal is outputted from the second portion of the pattern by performing an electromagnetic field analysis based on the pattern data when it is determined that the predetermined condition is satisfied;
determine whether the calculated characteristic is within a target range;
change the generation condition when it is determined that the calculated characteristic is not within the target range; and return to generate the pattern data after changing the generation condition.

2. The pattern generation device according to claim 1, wherein
the processor changes the generation condition so that the characteristic calculated based on pattern data generated based on the changed generation condition approaches the target range.

3. The pattern generation device according to claim 1, wherein
when it is determined that the predetermined condition is not satisfied, before returning to generate the pattern data, the processor changes the generation condition so that pattern data generated based on the changed generation condition approaches satisfaction of the predetermined condition.

4. The pattern generation device according to claim 1, wherein
when the processor generates the pattern data, the processor generates a plurality of weights respectively associated with a plurality of positions on the surface, and generates the pattern data based on the generated plurality of weights, and
wherein the generation condition is a condition for generating the plurality of weights.

5. The pattern generation device according to claim 4, wherein
when the processor generates the pattern data, the processor calculates a plurality of functions each having a position on the surface as a variable, the plurality of functions being related to the plurality of positions and having the plurality of weights, respectively, and generates the pattern in a corresponding unit region when an integrated value of the plurality of functions in the corresponding unit region is within a predetermined range for each of a plurality of unit regions into which the surface is divided, and does not generate the pattern in the corresponding unit region when the integrated value is not within the predetermined range.

6. The pattern generation device according to claim 5, wherein
the plurality of functions are Gaussian basis functions centered at the plurality of positions.

7. The pattern generation device according to claim 1, wherein
the predetermined condition is that the first portion and the second portion are physically connected via the pattern such that the first portion and the second portion are included in the same labeled connected region identified by the connected-component labeling operation.

8. The pattern generation device according to claim 7, wherein
when it is determined that the predetermined condition is not satisfied, before returning to generate the pattern data, the processor changes the generation condition so that a minimum distance between a pattern connected to the first portion and a pattern connected to the second portion in pattern data generated based on the changed generation condition becomes smaller.

9. The pattern generation device according to claim 8, wherein
when the processor generates the pattern data, the processor generates a plurality of different pattern data, and
the processor determines that the predetermined condition is satisfied when at least one of the plurality of different pattern data satisfies the predetermined condition, and determines that the predetermined condition is not satisfied when all of the plurality of different pattern data fail to satisfy the predetermined condition.

10. A pattern generation method that causes a computer to execute a process, the process comprising:

generating pattern data corresponding to a pattern of a metal layer provided on a surface of a dielectric layer based on a generation condition;

determining whether the generated pattern data satisfies a predetermined condition, wherein determining whether the generated pattern data satisfies the predetermined condition comprises: (i) identifying connected regions of the pattern represented by the pattern data by executing a connected-component labeling operation; and (ii) determining that the predetermined condition is satisfied when a first portion of the pattern and a second portion of the pattern are included in a same labeled connected region;

returning to generating the pattern data when it is determined that the predetermined condition is not satisfied;

calculating a characteristic of the pattern or an element or circuit having the pattern when a high-frequency signal is inputted to the first portion of the pattern and a high-frequency signal is outputted from the second portion of the pattern by performing an electromagnetic field analysis based on the pattern data when it is determined that the predetermined condition is satisfied;

determining whether the calculated characteristic is within a target range;

changing the generation condition when it is determined that the calculated characteristic is not within the target range; and returning to generating the pattern data after changing the generation condition.

11. A non-transitory computer-readable recording medium storing a program that causes a computer to execute a process, the process comprising:

generating pattern data corresponding to a pattern of a metal layer provided on a surface of a dielectric layer based on a generation condition;

determining whether the generated pattern data satisfies a predetermined condition, wherein determining whether the generated pattern data satisfies the predetermined condition comprises: (i) identifying connected regions of the pattern represented by the pattern data by executing a connected-component labeling operation; and (ii) determining that the predetermined condition is satisfied when a first portion of the pattern and a second portion of the pattern are included in a same labeled connected region;

returning to generating the pattern data when it is determined that the predetermined condition is not satisfied;

calculating a characteristic of the pattern or an element or circuit having the pattern when a high-frequency signal is inputted to the first portion of the pattern and a high-frequency signal is outputted from the second portion of the pattern by performing an electromagnetic field analysis based on the pattern data when it is determined that the predetermined condition is satisfied;

determining whether the calculated characteristic is within a target range;

changing the generation condition when it is determined that the calculated characteristic is not within the target range; and returning to generating the pattern data after changing the generation condition.

* * * * *